(12) United States Patent
Zhu

(10) Patent No.: US 10,700,186 B2
(45) Date of Patent: Jun. 30, 2020

(54) SILICON-CONTROLLED RECTIFIER STRUCTURE AND MANUFACTURING METHOD THEREOF

(71) Applicant: Shanghai Huali Microelectronics Corporation, Shanghai (CN)

(72) Inventor: Tianzhi Zhu, Shanghai (CN)

(*) Notice: Subject to any disclaimer, the term of this patent is extended or adjusted under 35 U.S.C. 154(b) by 0 days.

(21) Appl. No.: 16/192,818

(22) Filed: Nov. 16, 2018

(65) Prior Publication Data

US 2020/0058781 A1 Feb. 20, 2020

(30) Foreign Application Priority Data

Aug. 20, 2018 (CN) .......................... 2018 1 0948203

(51) Int. Cl.
*H01L 27/02* (2006.01)
*H01L 29/74* (2006.01)
*H01L 29/66* (2006.01)
*H01L 29/06* (2006.01)

(52) U.S. Cl.
CPC ...... *H01L 29/7424* (2013.01); *H01L 27/0262* (2013.01); *H01L 29/0649* (2013.01); *H01L 29/66363* (2013.01)

(58) Field of Classification Search
CPC ............. H01L 29/7424; H01L 27/0262; H01L 29/0649; H01L 29/66363
USPC ........................................................ 257/173
See application file for complete search history.

(56) References Cited

U.S. PATENT DOCUMENTS

| | | | | |
|---|---|---|---|---|
| 5,856,214 A | * | 1/1999 | Yu | H01L 27/0255 148/DIG. 174 |
| 6,465,848 B2 | * | 10/2002 | Ker | H01L 27/0251 257/335 |
| 6,791,146 B2 | * | 9/2004 | Lai | H01L 27/0262 257/162 |
| 2006/0151836 A1 | * | 7/2006 | Salcedo | H01L 27/0262 257/362 |

* cited by examiner

*Primary Examiner* — Didarul A Mazumder
(74) *Attorney, Agent, or Firm* — Kilpatrick Townsend & Stockton, LLP

(57) ABSTRACT

The present disclosure provides a silicon-controlled rectifier structure and a manufacturing method therefor. The silicon-controlled rectifier structure comprises a substrate; and an N-Well and a P-Well in the substrate, wherein an N-type heavily-doped region 410 and a P-type heavily-doped region 422 which are connected to an anode are provided in the N-Well, and a floating guard ring 416 is further provided in the N-Well between the N-type heavily-doped region 410 and the P-type heavily-doped region 422, the guard ring being spaced from the N-type heavily-doped region 410 by a shallow trench isolation, and an active area having a predetermined width exists between the guard ring and the P-type heavily-doped region 422; and an N-type heavily-doped region 414 and a P-type heavily-doped region 424 which are connected to a cathode are provided in the P-Well.

10 Claims, 5 Drawing Sheets

SILICON-CONTROLLED RECTIFIER STRUCTURE AND MANUFACTURING METHOD THEREOF

CROSS-REFERENCES TO RELATED APPLICATIONS

The present application claims priority to Chinese Patent Application No. 201810948203.1, filed on Aug. 20, 2018, entitled "SILICON-CONTROLLED RECTIFIER STRUCTURE AND MANUFACTURING METHOD THEREFOR", which is incorporated by reference herein for all purposes.

FIELD

The present disclosure relates to the field of semiconductor devices, and particularly to a silicon-controlled rectifier structure and a manufacturing method therefor.

BACKGROUND OF THE DISCLOSURE

In the field of electro-static discharge (ESD) protection designs, a silicon-controlled rectifier (SCR) has been widely recognized for its characteristic of a high ESD discharge capability, but there are two serious defects in this type of device limiting its applications: the first defect is a high triggering voltage for a snapback effect due to the fact that its triggering voltage is mainly limited by a high reverse breakdown voltage of an N-Well to a P-Well; and the second defect is a very low holding voltage for the snapback effect, which easily leads to a latch-up effect.

With regard to the defect of a high triggering voltage, various schemes have been proposed in the industry to reduce the triggering voltage for the snapback effect, such as the silicon-controlled rectifier structures shown in FIGS. 1 and 2. In the silicon-controlled rectifier shown in FIG. 1, between an N-Well and a P-Well, an N-type heavily-doped region spans the N-Well and the P-Well is inserted, so as to achieve the purpose of reducing a reverse breakdown voltage of the N-Well to the P-Well. In one embodiment, the silicon-controlled rectifier as shown in FIG. 1 comprises a P-type substrate 100, an N-type doped N-Well 210, a P-type doped P-Well 220, and an N-type heavily-doped region 412 and a P-type heavily-doped region 422 in the N-Well 210, an N-type heavily-doped region 414 and a P-type heavily-doped region 424 in the P-Well 220, and an N-type heavily-doped region 410 spans the N-Well 210 and the P-Well 220 at a position where the N-Well 210 abuts the P-Well 220. The N-type heavily-doped region 412, the P-type heavily-doped region 422, the N-type heavily-doped region 410, the N-type heavily-doped region 414 and the P-type heavily-doped region 424 are spaced apart by shallow trench isolations (STI) 300. The P-type heavily-doped region 422, the N-Well 210 and the substrate 100 form an equivalent PNP bipolar structure, the N-type heavily-doped region 412 and the N-Well 210 form a diffusion resistance equivalently connected to a base of the above-mentioned PNP bipolar, the P-type heavily-doped region 422 forms an emitter of the above-mentioned PNP bipolar, the substrate 100 is a collector of the above-mentioned PNP bipolar, and the N-Well 210 is the base of the above-mentioned PNP bipolar. The N-Well 210, the substrate 100/the P-Well 220, and the N-type heavily-doped region 414 form an equivalent NPN bipolar structure, the N-Well 210 forms a collector of the NPN bipolar, the N-type heavily-doped region 414 forms an emitter of the NPN bipolar, and the substrate 100/the P-Well 220 forms a base of the NPN bipolar. Moreover, the N-type heavily-doped region 412 and the P-type heavily-doped region 422 are connected to an anode of the silicon-controlled rectifier, and the N-type heavily-doped region 414 and the P-type heavily-doped region 424 are connected to a cathode of the silicon-controlled rectifier.

The silicon-controlled rectifier shown in FIG. 2 is formed on the basis of the silicon-controlled rectifier in FIG. 1, by removing a shallow trench isolation 300 between the N-type heavily-doped region 410 and the N-type heavily-doped region 414, and forming an N-type gate 430 on the surface of the substrate corresponding to a position where the shallow trench isolation 300 is removed and connecting the N-type gate to the cathode of the silicon-controlled rectifier, thus forming an N-type gated diode together with the P-Well 220. In the silicon-controlled rectifier as shown in FIG. 2, the N-type gated diode is introduced to further reduce the reverse breakdown voltage of the N-Well to the P-Well, but even so, the triggering voltage of the silicon-controlled rectifier shown in FIG. 2 is still high, for which, due to the limit by the existing process parameters, the adjustment freedom is not large and cannot meet the actual requirements.

With regard to the defect of a very low holding voltage for the snapback effect of the silicon-controlled rectifier, an ESD protection structure of the silicon-controlled rectifier as shown in FIG. 3 is further proposed in industry. Compared with the silicon-controlled rectifier as shown in FIG. 2, in the silicon-controlled rectifier shown in FIG. 3, the N-type heavily-doped region 410 spans the N-Well and the P-Well connects with the anode of the silicon-controlled rectifier directly, which is introduced to reduce the triggering voltage for the snapback effect of the silicon-controlled rectifier, and the P-type heavily-doped region 422 are directly connected to the anode of the silicon-controlled rectifier together, while the N-type heavily-doped region 412 connected to the anode of the device in FIG. 2 is removed. Since the N-type heavily-doped region 410, which has a high doping concentration and is provided between the N-Well 210 and the P-Well 220 in the silicon-controlled rectifier as shown in FIG. 3, is directly connected to the anode, the triggering voltage for the snapback effect of the silicon-controlled rectifier is directly determined by a breakdown voltage between the N-type heavily-doped region 410 and the P-Well 220, and is greatly reduced. Moreover, since the N-type heavily-doped region 410 is directly connected to the anode, an applied positive voltage can reduce the probability of holes being injected and migrated from the P-type heavily-doped region 422 to an N-well 210/P-well 220 interface, so that in the ESD protection structure of the silicon-controlled rectifier, the current gain of the parasitic PNP bipolar composed of the P-type heavily-doped region 422, the N-Well 210 and the P-Well 220 is greatly reduced, and thus the holding voltage for the snapback effect of the silicon-controlled rectifier as shown in FIG. 3 is increased accordingly.

FIG. 4 shows a snapback effect curve and a snapback effect electric leakage diagram of the silicon-controlled rectifier as shown in FIG. 3 obtained in a certain process platform, wherein a curve with diamond legends is the snapback effect curve of the silicon-controlled rectifier as shown in FIG. 3, and a curve with square legends is the snapback effect electric leakage curve of the silicon-controlled rectifier as shown in FIG. 3. It can be seen from the snapback effect curve of FIG. 4 that the triggering voltage of the silicon-controlled rectifier as shown in FIG. 3 is 8.4 V, which is less than a transient breakdown voltage of 11.6 V of a gate oxide layer of a 2.5V/3.3V peripheral interface circuit device in the process platform, and from the viewpoint of the triggering voltage, the silicon-controlled rectifier as shown in FIG. 3 is already applicable to the platform. However, the holding voltage of the silicon-controlled rectifier as shown in FIG. 3 is 3.2 V; although the voltage is greater than the maximum operating voltage (Vddmax=2.75V) of the 2.5V peripheral interface circuit in the process platform, it is still less than the maximum operating voltage (Vddmax=3.65V) of the 3.3V peripheral interface circuit in the process platform.

This indicates that although the silicon-controlled rectifier as shown in FIG. 3 is already completely applicable to an ESD protection circuit design of the 2.5V peripheral interface circuit in the process platform, for an ESD protection circuit design of the 3.3V peripheral interface circuit in the process platform, its holding voltage needs to be further increased above 4V.

Therefore, there is an urgent need for a new silicon-controlled rectifier, which can further reduce the triggering voltage for the snapback effect, and further increase the holding voltage.

BRIEF SUMMARY OF THE DISCLOSURE

As described above, in order to increase the holding voltage while reducing the triggering voltage for the snapback effect of the silicon-controlled rectifier, the present disclosure provides a silicon-controlled rectifier structure, comprising: a substrate (100); and an N-Well (210) and a P-Well (220) in the substrate (100), the N-Well (210) abutting the P-Well (220), wherein an N-type heavily-doped region (410) and a P-type heavily-doped region (422) which are connected to an anode are provided in the N-Well (210), the N-type heavily-doped region (410) spans the N-Well (210) and the P-Well (220), and a floating guard ring (416) is further provided in the N-Well (210) between the N-type heavily-doped region (410) and the P-type heavily-doped region (422), the guard ring (416) being spaced from the N-type heavily-doped region (410) by a shallow trench isolation, and an active area having a predetermined width being provided between the guard ring (416) and the P-type heavily-doped region (422); and an N-type heavily-doped region (414) and a P-type heavily-doped region (424) which are connected to a cathode are provided in the P-Well (220), the N-type heavily-doped region (414) being spaced from the P-type heavily-doped region (424) by a shallow trench isolation, and a gated diode connected to the cathode exists between the N-type heavily-doped region (414) and the N-type heavily-doped region (410).

The silicon-controlled rectifier structure as described above, wherein the guard ring (416) is an N-type heavily-doped region.

The silicon-controlled rectifier structure as described above, wherein the concentration of heavily-doped ions in the guard ring (416) ranges from $1E14\ cm^{-2}$ to $1E16\ cm^{-2}$.

The silicon-controlled rectifier structure as described above, wherein the width of the guard ring (416) ranges from 0.1 um to 10 um.

The silicon-controlled rectifier structure as described above, wherein the predetermined width of the active area ranges from 0.2 um to 10 um.

The silicon-controlled rectifier structure as described above, wherein a P-type doped, ESD heavily-doped region (500) is further provided in the P-Well (220) under the N-type heavily-doped region (410) and abutting the N-Well (210).

The present disclosure further provides a manufacturing method for a silicon-controlled rectifier structure, comprising: providing a substrate (100); forming an N-Well (210) and a P-Well (220) in the substrate (100), the N-Well (210) abutting the P-Well (220); forming an N-type heavily-doped region (410) spans the N-Well (210) and the P-Well (220) at a position where the N-Well (210) abuts the P-Well (220); forming a P-type heavily-doped region (422) in the N-Well (210); forming a guard ring (416) between the N-type heavily-doped region (410) and the P-type heavily-doped region (422); forming an N-type heavily-doped region (414) and a P-type heavily-doped region (424) in the P-Well (220); forming a shallow trench isolation between the guard ring (416) and the N-type heavily-doped region (410), and between the N-type heavily-doped region (414) and the P-type heavily-doped region (424), an active area having a predetermined width exists between the guard ring (416) and the P-type heavily-doped region (422); forming a gated diode between the N-type heavily-doped region (414) and the N-type heavily-doped region (410); and connecting the N-type heavily-doped region (410) and the P-type heavily-doped region (422) to the anode, floating the guard ring (416) and connecting the N-type heavily-doped region (414) and the P-type heavily-doped region (424), and a gate (430) of the gated diode to the cathode.

The manufacturing method as described above, wherein the step of forming the guard ring (416) further comprises: performing N-type ion heavy doping between the N-type heavily-doped region (410) and the P-type heavily-doped region (422), the concentration of the N-type ion heavy doping ranging from $1E14\ cm^{-2}$ to $1E16\ cm^{-2}$.

The manufacturing method as described above, further comprises: forming a shallow trench isolation abutting the P-type heavily-doped region (422) on a side of the N-Well (210) opposite to a side abutting the P-Well (220); and forming a shallow trench isolation abutting the P-type heavily-doped region (424) on a side of the P-Well (220) opposite to a side abutting the N-Well (210).

The manufacturing method as described above, comprises forming the guard ring (416) having the width ranging from 0.1 um to 10 um.

The manufacturing method as described above, comprises forming the guard ring (416) within the N-Well (210) at a distance of 0.2 um to 10 um from the P-type heavily-doped region (422).

The manufacturing method as described above, further comprises forming a P-type doped, ESD heavily-doped region (500) in the P-Well (220) under the N-type heavily-doped region (410) and abutting the N-Well (210).

The silicon-controlled rectifier structure manufactured according to the manufacturing method provided in the present disclosure can effectively reduce the triggering voltage of the silicon-controlled rectifier, and by inserting the floating N-type heavily-doped region between the P-type heavily-doped region connected to the anode and the N-type heavily-doped region spans the N-Well and the P-Well, which is equivalent to introducing a weakened guard ring, when holes flowing in the vicinity of the guard ring 416, some of the holes injected from the P-type heavily-doped region 422 into the N-Well 210 will be annihilated due to a recombination action with a large number of electrons in the guard ring 416, thereby effectively reducing the probability of the holes of the parasitic PNP bipolar being injected and migrated from the emitter 422 to the N-type heavily-doped region 410 at the junction of the N-Well and the P-Well, and thus effectively reducing the current gain of the parasitic PNP bipolar, and functioning to increase the holding voltage. Moreover, there is no shallow trench isolation but an active area (AA) between the guard ring 416 and the P-type heavily-doped region 422 which is connected to the anode, holes injected from the P-type heavily-doped region 422 into the N-Well 210 have more opportunities to flow in the vicinity of the guard ring 416 due to the electric field distribution, and are annihilated due to a recombination action with a large number of electrons in the guard ring 416; therefore, compared with the shallow trench isolation structure between the guard ring 416 and the P-type heavily-doped region 422 which is connected to the anode, the effect of the structure involved in the present disclosure reducing the current gain of the parasitic bipolar and increasing the holding voltage is better.

REFERENCE NUMERALS

Figure 1:
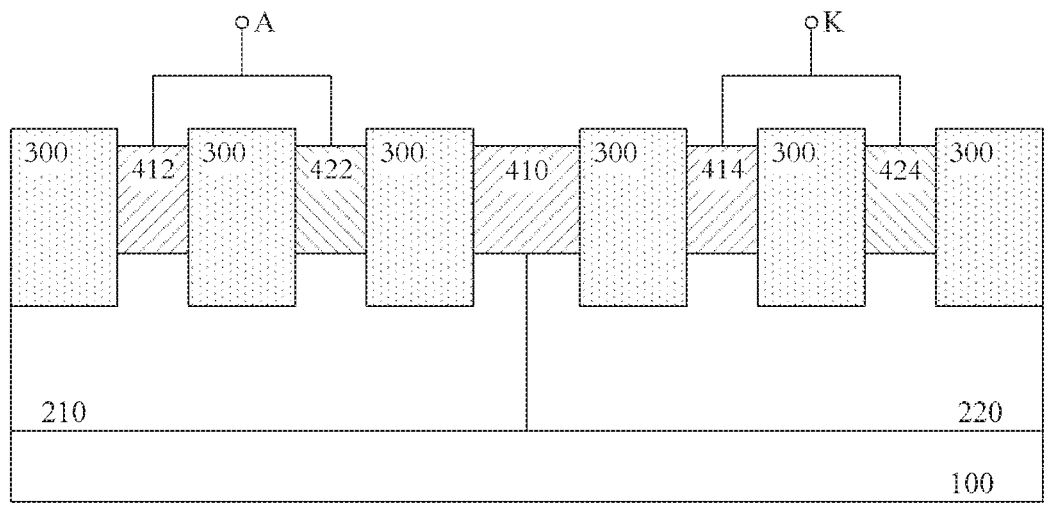
FIG. 1 shows a schematic structural diagram of an existing silicon-controlled rectifier.
Figure 2:
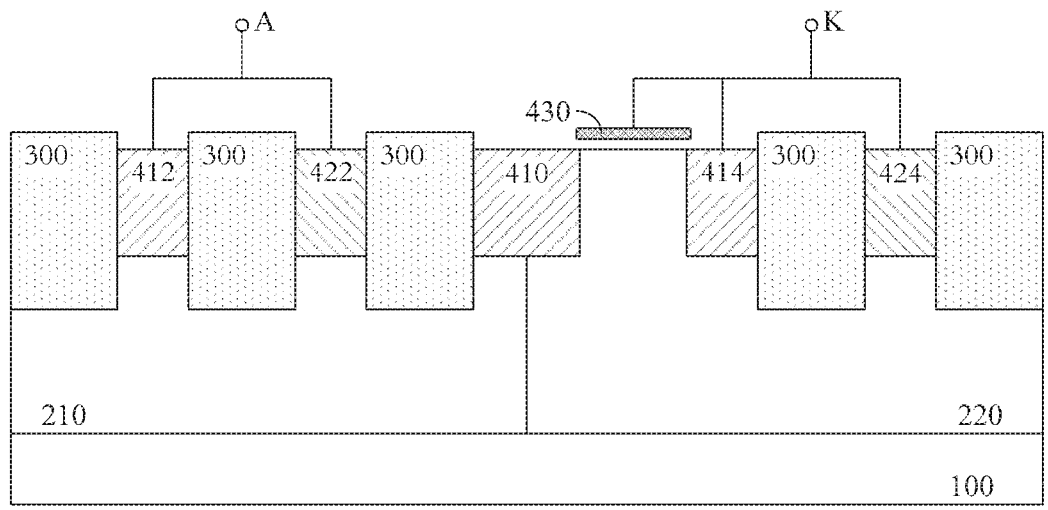
FIG. 2 shows a schematic structural diagram of another existing silicon-controlled rectifier.
Figure 3:
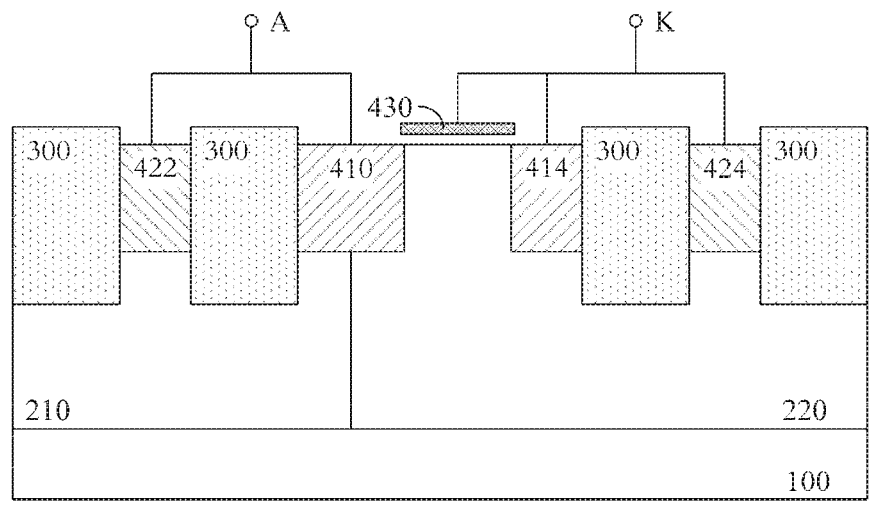
FIG. 3 shows a schematic structural diagram of another existing silicon-controlled rectifier.
Figure 4:
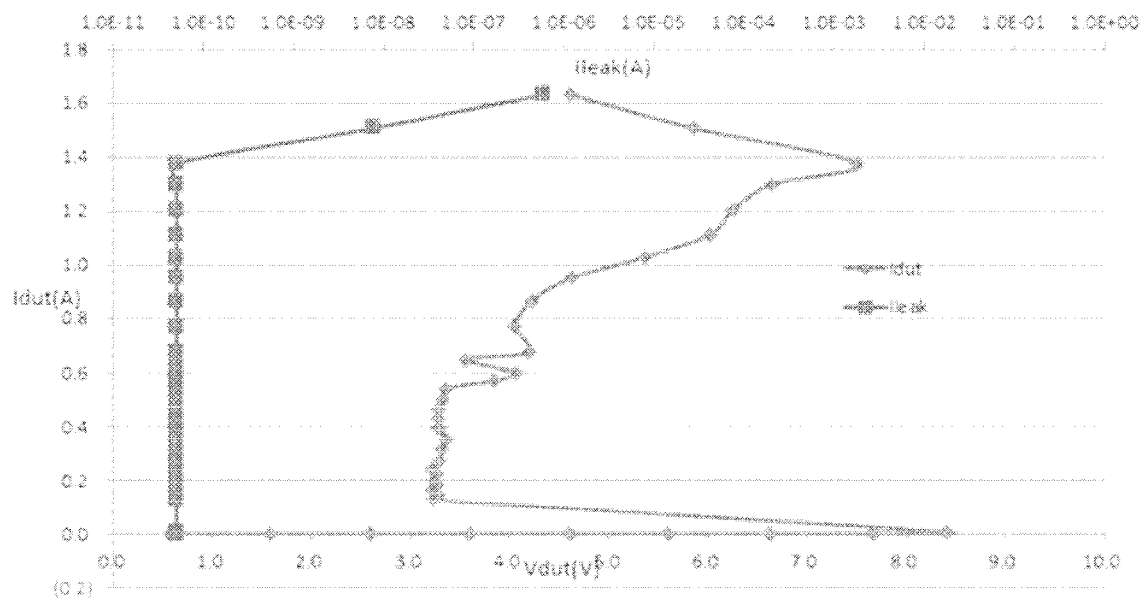
FIG. 4 shows a snapback effect curve and a snapback effect electric leakage curve of the silicon-controlled rectifier shown in FIG. 3.

Substrate 100
N-Well 210
P-Well 220
Shallow trench isolation 300
N-type heavily-doped regions 410, 412, 414
Guard ring 416
P-type heavily-doped regions 422, 424
Gate of a gated diode 430
ESD heavily-doped region 500

DETAILED DESCRIPTION OF THE DISCLOSURE

In order to provide a silicon-controlled rectifier that can meet the requirements of a process platform, and has a low triggering voltage and maintains a high holding voltage, the present disclosure provides a silicon-controlled rectifier structure and a manufacturing method therefor. The present disclosure also provides other embodiments.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by other features serving the same, equivalent, or similar purpose. Therefore, unless expressly stated otherwise, each feature disclosed is only one example of a group of equivalent or similar features.

Note that when used, the flags left, right, front, back, top, bottom, front, back, clockwise, and counter-clockwise are used for convenience purposes only and do not imply any fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As described above, the present disclosure provides a silicon-controlled rectifier structure that meets parameters requirements of a process platform and a manufacturing method therefor. In one embodiment, FIG. 5 shows a schematic flow diagram of the manufacturing method provided in the present disclosure, for the manufacturing of the silicon-controlled rectifier shown in FIGS. 6 and 7.

Figure 5:
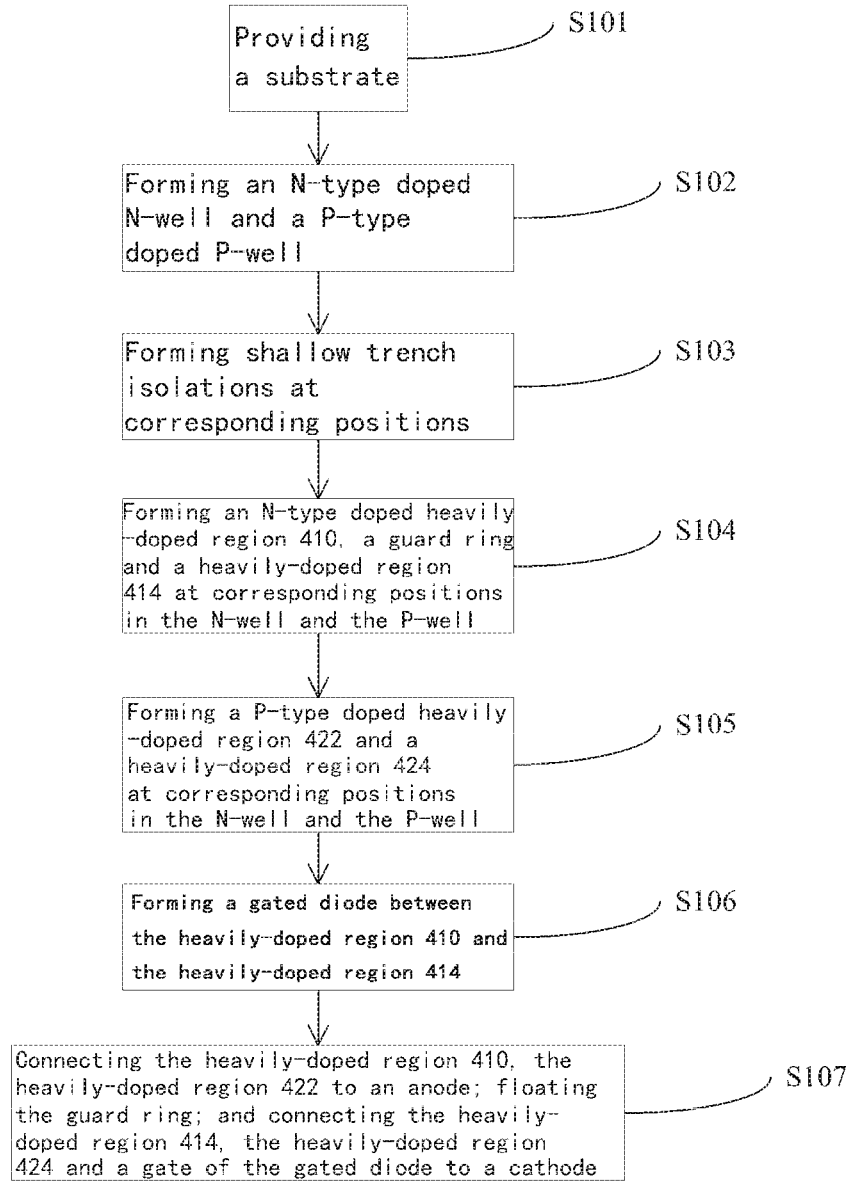
FIG. 5 shows a schematic flow diagram of the manufacturing method provided in the present disclosure.

Firstly, as shown in FIG. 5, a step S101 is performed: providing a substrate. The substrate can be a semiconductor wafer, such as a silicon wafer. In some embodiments, the substrate may include an elemental semiconductor material, a compound semiconductor material, and/or an alloy semiconductor material. Examples of elemental semiconductor materials may be, but are not limited to, crystalline silicon, polycrystalline silicon, amorphous silicon, germanium, and/or diamond. Examples of compound semiconductor materials may be, but not limited to, silicon carbide, gallium arsenide, gallium phosphide, indium phosphide, indium arsenide, and/or indium antimonide. Examples of alloy semiconductor materials may be, but not limited to, SiGe, GaAsP, AlInAs, AlGaAs, GaInAs, GaInP, and/or GaInAsP. In one embodiment, the substrate is a P-type doped P-type substrate.

In step S102, forming an N-type doped N-Well and a P-type doped P-Well. The formation of each well includes at least three to five steps to complete the fabrication, including, but not limited to, epitaxial growth, native oxide growth, ion implantation using a mask, and another high-energy ion implantation and annealing.

In step S103, forming shallow trench isolations (STI) at corresponding positions, wherein the shallow trench isolation (STI) process includes, but is not limited to, shallow trench etching, oxide filling, and oxide planarization. Among these, the shallow trench etching includes but is not limited to isolating an oxide layer, depositing a nitride, performing shallow trench isolation with a mask and performing STI shallow trench etching. Among these, the STI oxide fill includes but is not limited to trench liner silicon oxide, trench CVD (chemical vapor deposition) oxide fill or PVD (physical vapor deposition) oxide fill. Among these, the planarization of the silicon surface can be implemented by means of various methods. The planarization of the silicon wafer can be implemented by using SOG (spin-on-glass) filling gaps, and the SOG can be formed of 80% solvent and 20% silicon dioxide, and after the deposition, the SOG is baked, the solvent is evaporated off, and the silicon dioxide is remained in the gaps, and it is also possible to conduct back etching of the entire surface to reduce the thickness of the entire wafer. The planarization treatment can also be effectively performed through a CMP process (also referred to as a polishing process) including, but not limited to, polishing a trench oxide (chemical mechanical polishing can be used) and removing nitride. Those skilled in the art should learn that the an electrical isolation between substrates and between devices can be effectively achieved by means of the shallow trench isolation described above.

In step S104, forming an N-type heavily-doped region 410, a guard ring and an N-type heavily-doped region 414 at corresponding positions in the N-Well and the P-Well, wherein, in this embodiment, the N-type doping may adopt a dopant, such as, arsenic (As), phosphorus (P) or other group V elements or combinations thereof. The N-type heavily-doped region 410 lies at a position where the N-Well abuts the P-Well, and the N-type heavily-doped region 410 spans the N-Well and the P-Well, the guard ring lies in the N-Well and is spaced from the N-type heavily-doped region 410 by a shallow trench isolation; the N-type heavily-doped region 414 lies in the P-Well and is spaced from the N-type heavily-doped region 410 by a distance, so that the part of the P-Well between the N-type heavily-doped region 410 and the N-type heavily-doped region 414 forms a gated diode in a subsequent step.

In step S105, forming a P-type heavily-doped region 422 and a P-type heavily-doped region 424 at corresponding positions in the N-Well and the P-Well, wherein, in this embodiment, the P-type doping may adopt a dopant, such as, boron (B), or other group III elements. The P-type heavily-doped region 422 lies in the N-Well and is spaced from the guard ring by a distance, and there is no shallow trench isolation but an active area (AA) between the P-type heavily-doped region 422 and the guard ring.

In the above-mentioned embodiments, the P-type heavily-doped region 422, the N-Well and the P-Well composes a parasitic PNP bipolar in the silicon-controlled rectifier, and therefore reducing the current gain of the parasitic bipolar can increase the holding voltage of the silicon-controlled rectifier. Moreover, by inserting the floating N-type doped guard ring between the N-type heavily-doped region 410 and the P-type heavily-doped region 422, when flowing in the vicinity of the guard ring, some of the holes injected from the P-type heavily-doped region 422 into the N-Well 210 will be annihilated due to a recombination action with a large number of electrons in the guard ring, thereby effectively reducing the probability of the holes of the parasitic PNP bipolar being injected and migrated from the emitter 422 to the N-type heavily-doped region 410 at the junction of the N-Well and the P-Well, and thus effectively reducing the current gain of the parasitic bipolar, and effectively increasing the holding voltage. Moreover, in this embodiment, since there is no shallow trench isolation but an active area between the P-type heavily-doped region 422 and the guard ring, holes injected from the P-type heavily-doped region 422 into the N-Well 210 have more opportunities to flow in the vicinity of the guard ring due to the electric field distribution, and are annihilated due to a recombination action with a large number of electrons in the guard ring; therefore, compared with the shallow trench isolation structure between the guard ring and the P-type heavily-doped region which is connected to the anode, the effect of the structure involved in the present disclosure reducing the current gain of the parasitic bipolar, and increasing the holding voltage is better.

In step S106, forming a gated diode between the N-type heavily-doped region 410 and the N-type heavily-doped region 414. As described above, the gated diode formed between the N-type heavily-doped region 410 and the N-type heavily-doped region 414 can effectively reduce the triggering voltage of the silicon-controlled rectifier.

In step S107, connecting the N-type heavily-doped region 410 and the P-type heavily-doped region 422 to the anode, so that the guard ring is floated, and connecting the N-type heavily-doped region 414, the P-type heavily-doped region 424 and a gate 430 of the gated diode to the cathode. Accordingly, the silicon-controlled rectifier with a low triggering voltage and a high holding voltage has been formed, and the electrical characteristics of the silicon-controlled rectifier described above can meet the parameter requirements of the process platform.

In one embodiment, the holding voltage for the snapback effect is adjusted by controlling the width of the guard ring, and controlling the distance between the guard ring and the P-type heavily-doped region 422. In one embodiment, the width of the guard ring can be adjusted within the range of 0.1 um to 10 um, and the distance between the guard ring and the P-type heavily-doped region 422 can be adjusted to be from 0.2 um to 10 um, so that the designed silicon-controlled rectifier has superior electrical characteristics.

In another embodiment, the manufacturing method provided in the present disclosure further comprises forming, in the P-Well, a P-type heavily-doped ESD ion implantation at the position where the P-Well abuts the N-Well, wherein the ESD heavily-doped region 500 abuts the N-type heavily-doped region 410 spans the N-Well and the P-Well, and lies in the P-Well under the N-type heavily-doped region 410. By setting the ESD heavily-doped region, the reverse breakdown voltage of the N-Well/P-Well can be further effectively reduced, thereby effectively reducing the triggering voltage for the snapback effect of the silicon-controlled rectifier.

Figure 6:
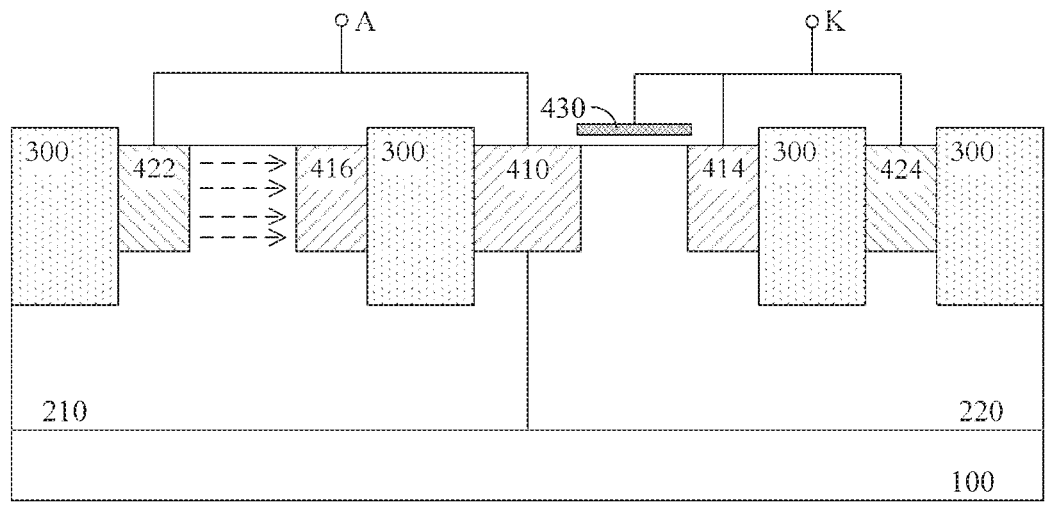
FIG. 6 shows a schematic structural diagram of an embodiment of the silicon-controlled rectifier provided in the present disclosure.
Figure 7:
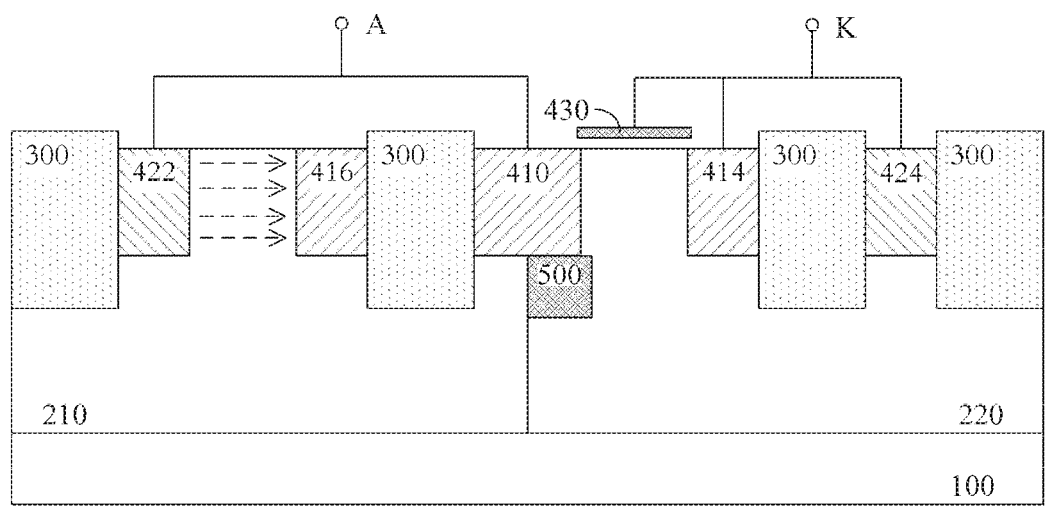
FIG. 7 shows a schematic structural diagram of another embodiment of the silicon-controlled rectifier provided in the present disclosure.

FIG. 6 shows a schematic structural diagram of the silicon-controlled rectifier provided in the present disclosure, and FIG. 7 shows a schematic structural diagram of the silicon-controlled rectifier that forms an ESD heavily-doped region in the silicon-controlled rectifier shown in FIG. 6 to further reduce the triggering voltage of the silicon-controlled rectifier.

As shown in FIG. 6, the silicon-controlled rectifier provided in the present disclosure comprises a substrate 100, an N-Well 210, a P-Well 220, several shallow trench isolations 300, an N-type heavily-doped region 410, a guard ring 416, an N-type heavily-doped region 414, a P-type heavily-doped region 422 and a P-type heavily-doped region 424, wherein the N-type heavily-doped region 410 and the P-type heavily-doped region 422 are connected to an anode, the guard ring 416 is floated, a gated diode 430 is formed between the N-type heavily-doped region 410 and the N-type heavily-doped region 414, and the N-type heavily-doped region 414, the P-type heavily-doped region 424 and a gate 430 of the gated diode are connected to the cathode. In one embodiment, the substrate 100 is a P-type doped substrate.

In the above-mentioned embodiment, the P-type heavily-doped region 422, the N-Well 210 and the P-Well 220 form a parasitic PNP bipolar in the silicon-controlled rectifier, and therefore reducing the current gain of the parasitic bipolar increases the holding voltage of the silicon-controlled rectifier. Moreover, by inserting the floating N-type doped guard ring 416 between the N-type heavily-doped region 410 and the P-type heavily-doped region 422, when holes flowing in the vicinity of the guard ring, some of the holes injected from the P-type heavily-doped region 422 into the N-Well 210 will be annihilated due to a recombination action with a large number of electrons in the guard ring, thereby effectively reducing the probability of the holes of the parasitic PNP bipolar being injected and migrated from the emitter 422 to the N-type heavily-doped region 410 at the junction of the N-Well and the P-Well, and thus effectively reducing the current gain of the parasitic bipolar, and effectively increasing the holding voltage. Moreover, in this embodiment, since there is no shallow trench isolation but an active area between the P-type heavily-doped region 422 and the guard ring, holes injected from the P-type heavily-doped region 422 into the N-Well 210 have more opportunities to flow in the vicinity of the guard ring due to the electric field distribution, and are annihilated due to a recombination action with a large number of electrons in the guard ring; therefore, compared with the shallow trench isolation structure between the guard ring and the P-type heavily-doped region which is connected to the anode, the effect of the structure involved in the present disclosure reducing the current gain of the parasitic bipolar, and increasing the holding voltage is better.

In one embodiment, in the above-mentioned embodiment, the holding voltage for the snapback effect is adjusted by controlling the width of the guard ring 416, and controlling the distance between the guard ring 416 and the P-type heavily-doped region 422. In one embodiment, the width of the guard ring 416 can be adjusted within the range of 0.1 um to 10 um, and the distance between the guard ring 416 and the P-type heavily-doped region 422 can be adjusted to be from 0.2 um to 10 um, so that the designed silicon-controlled rectifier has superior electrical characteristics.

In another embodiment, as shown in FIG. 7, an ESD heavily-doped region 500 is further formed in the P-Well 220, wherein the ESD heavily-doped region 500 is P-type doped and lies at a position where the P-Well 220 abuts the N-Well 210, and the ESD heavily-doped region 500 abuts the N-type heavily-doped region 410 spans the N-Well 210 and the P-Well 220, and lies in the P-Well 220 under the N-type heavily-doped region 410. By setting the ESD heavily-doped region 500, the reverse breakdown voltage of the N-Well/P-Well can be further effectively reduced, thereby effectively reducing the triggering voltage for the snapback effect of the silicon-controlled rectifier, so that the silicon-controlled rectifier as shown in FIG. 7 has more superior electrical characteristics.

Figure 8:
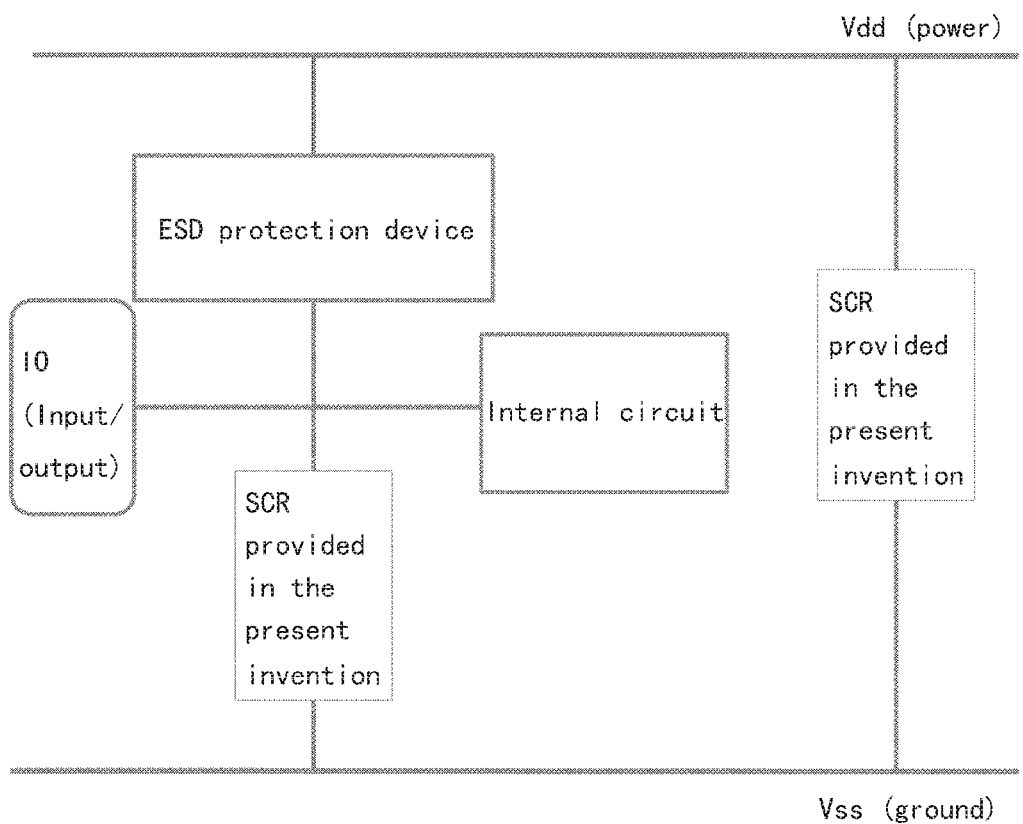
FIG. 8 shows a schematic diagram of an application scenario for the silicon-controlled rectifier provided in the present disclosure.

FIG. 8 shows a schematic diagram of an application scenario for the silicon-controlled rectifier provided in the present disclosure. As shown in FIG. 8, the application of the silicon-controlled rectifier provided in the present disclosure to an ESD protection circuit can effectively functions to protect the circuit.

So far, the embodiments of a silicon-controlled rectifier structure and a manufacturing method therefor have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A silicon-controlled rectifier structure, comprising:
a substrate; and
an N-Well and a P-Well in the substrate, the N-Well abutting the P-Well, wherein
an N-type heavily-doped region and a P-type heavily-doped region which are connected to an anode are provided in the N-Well, the N-type heavily-doped region spans the N-Well and the P-Well, and a floating guard ring is further provided in the N-Well between the N-type heavily-doped region and the P-type heavily-doped region, the floating guard ring being spaced from the N-type heavily-doped region by a shallow trench isolation, and an active area having a predetermined width exists between the floating guard ring and the P-type heavily-doped region; and
an N-type heavily-doped region and a P-type heavily-doped region which are connected to a cathode are provided in the P-Well, the N-type heavily-doped region being spaced from P-type heavily-doped region by a shallow trench isolation, and a gated diode connected to the cathode being provided between the N-type heavily-doped region and the N-type heavily-doped region;
wherein a P-type doped, ESD heavily-doped region is further provided in the P-Well under the N-type heavily-doped region and abutting the N-Well.

2. The silicon-controlled rectifier structure of claim 1, wherein the floating guard ring is an N-type heavily-doped region.

3. The silicon-controlled rectifier structure of claim 2, wherein the concentration of heavily-doped ions in the floating guard ring ranges from 1E14 $cm^{-2}$ to 1E16 $cm^{-2}$.

4. The silicon-controlled rectifier structure of claim 1, wherein the width of the floating guard ring ranges from 0.1 um to 10 um.

5. The silicon-controlled rectifier structure of claim 1, wherein the predetermined width of the active area ranges from 0.2 um to 10 um.

6. A manufacturing method for a silicon-controlled rectifier structure, comprising:
providing a substrate;
forming an N-Well and a P-Well in the substrate, the N-Well abutting the P-Well;
forming an N-type heavily-doped region spans the N-Well and the P-Well at a position where the N-Well abuts the P-Well;
forming a P-type heavily-doped region in the N-Well;

forming a guard ring between the N-type heavily-doped region and the P-type heavily-doped region;

forming an N-type heavily-doped region and a P-type heavily-doped region in the P-Well;

forming a P-type doped, ESD heavily-doped region in the P-Well under the N-type heavily-doped region and abutting the N-Well;

forming a shallow trench isolation between the guard ring and the N-type heavily-doped region, an active area having a predetermined width exists between the guard ring and the P-type heavily-doped region;

forming a shallow trench isolation between the N-type heavily-doped region and the P-type heavily-doped region;

forming a gated diode between the N-type heavily-doped region and the N-type heavily-doped region; and connecting the N-type heavily-doped region and the P-type heavily-doped region to the anode, floating the guard ring and connecting the N-type heavily-doped region, the P-type heavily-doped region, and a gate of the gated diode to the cathode.

7. The manufacturing method of claim 6, wherein the step of forming the guard ring further comprises: performing N-type ion heavy doping between the N-type heavily-doped region and the P-type heavily-doped region, the concentration of the N-type ion heavy doping ranging from $1E14\ cm^{-2}$ to $1E16\ cm^{-2}$.

8. The manufacturing method of claim 6, further comprising:

forming a shallow trench isolation abutting the P-type heavily-doped region on a side of the N-Well opposite to a side abutting the P-Well; and forming a shallow trench isolation abutting the P-type heavily-doped region on a side of the P-Well opposite to a side abutting the N-Well.

9. The manufacturing method of claim 6, comprising forming the guard ring having the width ranging from 0.1 um to 10 um.

10. The manufacturing method of claim 6, comprising forming the guard ring within the N-Well at a distance of 0.2 um to 10 um from the P-type heavily-doped region.

* * * * *